United States Patent
Wang

(10) Patent No.: US 10,619,240 B2
(45) Date of Patent: Apr. 14, 2020

(54) GAS DIFFUSION DEVICE AND FILM-FORMING APPARATUS

(71) Applicant: Wuhan China Star Optoelectronics Semiconductor Display Technology Co., Ltd., Wuhan (CN)

(72) Inventor: Gaozhen Wang, Shenzhen (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 211 days.

(21) Appl. No.: 15/577,666

(22) PCT Filed: Sep. 21, 2017

(86) PCT No.: PCT/CN2017/102574
§ 371 (c)(1),
(2) Date: Nov. 28, 2017

(87) PCT Pub. No.: WO2019/033502
PCT Pub. Date: Feb. 21, 2019

(65) Prior Publication Data
US 2019/0211447 A1  Jul. 11, 2019

(30) Foreign Application Priority Data
Aug. 16, 2017 (CN) .......................... 2017 1 0716215

(51) Int. Cl.
*C23C 16/40* (2006.01)
*C23C 16/455* (2006.01)
(Continued)

(52) U.S. Cl.
CPC ........ *C23C 16/45508* (2013.01); *C23C 14/04* (2013.01); *C23C 16/4582* (2013.01);
(Continued)

(58) Field of Classification Search
CPC ........ C23C 16/45508; C23C 16/45559; C23C 14/04; C23C 16/4582; C23C 16/455; H01L 51/52; H01L 51/56
(Continued)

(56) References Cited

U.S. PATENT DOCUMENTS 5,370,738 A  * 12/1994  Watanabe ............. C23C 16/455
                                                            118/715
5,805,973 A     9/1998  Coffinberry et al.
(Continued)

FOREIGN PATENT DOCUMENTS

CN  102011096 A  4/2011
CN  103160788 A  6/2013

*Primary Examiner* — Rudy Zervigon
(74) *Attorney, Agent, or Firm* — Brinks Gilson & Lione

(57) ABSTRACT

Embodiments of the present disclosure provide a gas diffusion device and a film-forming apparatus. The gas diffusion device includes a cover plate, a first diffusion part and a second diffusion part. The first diffusion part cooperates with the cover plate to define a first diffusion space and a gas inlet that communicates with the first diffusion space. The second diffusion part cooperates with the cover plate to define a second diffusion space and a gas outlet that communicates with the second diffusion space. The second diffusion space communicates with the first diffusion space. In a direction from the gas inlet to the gas outlet, a gas between the first diffusion part and the cover plate decreases in height gradually, and a gap between the second diffusion part and the cover plate increases in height gradually at first and then decreases in height gradually.

18 Claims, 3 Drawing Sheets

(51) Int. Cl.
   *C23C 14/04*     (2006.01)
   *H01L 51/52*     (2006.01)
   *H01L 51/56*     (2006.01)
   *C23C 16/458*    (2006.01)

(52) U.S. Cl.
   CPC ........ *C23C 16/45559* (2013.01); *H01L 51/52* (2013.01); *H01L 51/56* (2013.01); *H01L 51/5253* (2013.01)

(58) Field of Classification Search
   USPC .................. 118/715; 156/345.33, 345.34
   See application file for complete search history.

(56) References Cited

U.S. PATENT DOCUMENTS

| | | |
|---|---|---|
| 6,428,847 B1 | 8/2002 | Grant et al. |
| 6,663,025 B1 | 12/2003 | Halsey et al. |
| 8,628,616 B2 * | 1/2014 | Takasuka ............ C23C 16/4401 118/715 |
| 2010/0006031 A1 | 1/2010 | Choi et al. |
| 2010/0310772 A1 | 12/2010 | Tsuda |
| 2012/0152171 A1 | 6/2012 | Lee et al. |
| 2017/0096738 A1 | 4/2017 | Kurita et al. |
| 2017/0186949 A1 | 6/2017 | Jing |

* cited by examiner

GAS DIFFUSION DEVICE AND FILM-FORMING APPARATUS

CROSS-REFERENCE TO RELATED APPLICATIONS

The present application is a 35 U.S.C. § 371 National Phase conversion of International (PCT) Patent Application No. PCT/CN2017/102574 filed Sep. 21, 2017, which claims foreign priority of Chinese Patent Application No. 201710716215.7, filed on Aug. 16, 2017 in the State Intellectual Property Office of China, the contents of all of which are hereby incorporated by reference.

TECHNICAL FIELD

The present disclosure generally relates to the technical field of film coating, and more particularly, to a gas diffusion device and a film-forming apparatus.

BACKGROUND

An organic lighting-emitting diode (OLED) is an organic thin-film electroluminescent device having merits of a low cost, a wide viewing angle, a high contrast ratio, and a capability of flexibly displaying, and thus has attracted great attention.

The OLED display device needs to undergo thin film encapsulation (TFE) in order to achieve the function of flexibly displaying. The TFE utilizes a film-forming apparatus to inject gases such as $N_2$, $N_2O$, $SiH_4$, $NH_3$, HMDSO, TMA into a chamber for reaction. The quality of the TFE film directly influences the vapor permeability, and parameters for evaluating the quality of the film include the uniformity, the thickness, the surface flatness, the tightness or the like of the film. Whether the gas can diffuse uniformly has a direct influence on the quality of the formed film, such as the surface flatness, the tightness or the uniformity of the film. Gas diffusion devices currently available have relatively complicated structures and unsatisfactory diffusion effects, so the film coating quality is likely to be unsatisfactory.

SUMMARY

A primary technical problem to be solved by the present disclosure is to provide a gas diffusion device and a film-forming apparatus, which can solve problems in the prior art that gas diffusion devices have complicated structures and the gas diffusion therein is not uniform.

To solve the aforesaid technical problem, an embodiment of the present disclosure provides a gas diffusion device which comprises a cover plate, a first diffusion part and a second diffusion part. The first diffusion part cooperates with the cover plate to form a first diffusion space and a gas inlet that communicates with the first diffusion space. The second diffusion part cooperates with the cover plate to form a second diffusion space and a gas outlet that communicates with the second diffusion space. The second diffusion space communicates with the first diffusion space so that the gas fed into the gas inlet travels through the first diffusion space and the second diffusion space and then exits from the gas outlet. In a direction from the gas inlet to the gas outlet, a gap between the first diffusion part and the cover plate decreases in height gradually, and a gap between the second diffusion part and the cover plate increases in height gradually at first and then decreases in height gradually.

An embodiment of the present disclosure further provides a film-forming apparatus, which comprises the aforesaid gas diffusion device.

As compared to the prior art, benefits of the present disclosure are as follows: two times of diffusion are implemented, and in the direction from the gas inlet to the gas outlet, the gap between the first diffusion part and the cover plate decreases in height gradually, while the gap between the second diffusion part and the cover plate increases in height gradually at first and then decreases in height gradually. The gap between the first diffusion part and the cover plate decreasing in height gradually is favorable for the gas to rise and flow in the first diffusion space and diffuse relatively fully for the first time, and the gas is mixed uniformly and then diffuses sufficiently in the second diffusion space to generate uniform gas, thereby improving the uniform diffusion efficiency of the gas and the utilization ratio of the gas.

DETAILED DESCRIPTION

Technical solutions of embodiments of the present disclosure will be described clearly and completely with reference to the attached drawings illustrating the embodiments of the present disclosure. Obviously, the embodiments described herein are only a part of but not all of the embodiments of the present disclosure. All other embodiments that can be obtained by those of ordinary skill in the art from the embodiments of the present disclosure without making creative efforts shall fall within the scope of the present disclosure.

Figure 1:
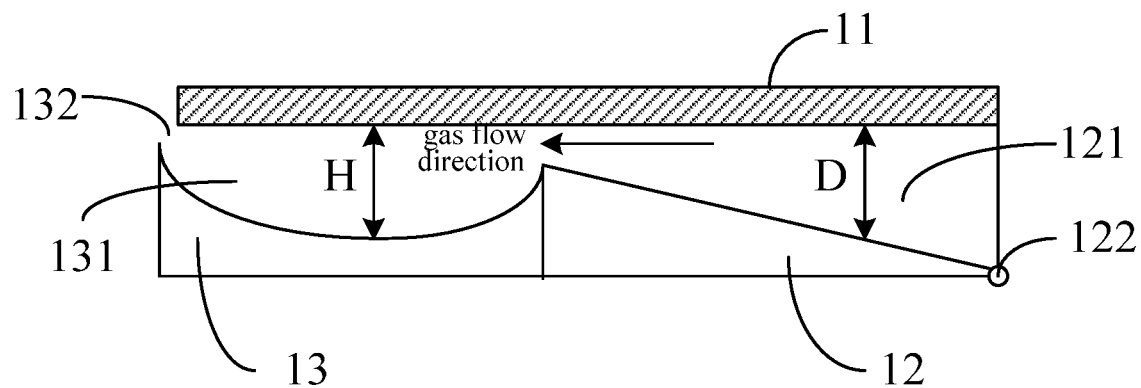
FIG. 1 is a schematic structural side view of an embodiment of gas diffusion according to the present disclosure.

Referring to FIG. 1, an embodiment of a gas diffusion device according to the present disclosure can comprise a cover plate 11, a first diffusion part 12 and a second diffusion part 13. The first diffusion part 12 cooperates with the cover plate 11 to define a first diffusion space 121. The first diffusion part 12 defines a gas inlet 122 that communicates with the first diffusion space 121. The second diffusion part 13 cooperates with the cover plate 11 to define a second diffusion space 131 and a gas outlet 132 that communicates with the second diffusion space 131. The second diffusion space 131 communicates with the first diffusion space 121 so that the gas fed into the gas inlet 122 travels through the first diffusion space 121 and the second diffusion space 131 and then exits from the gas outlet 132.

In a direction from the gas inlet 122 to the gas outlet 132, a height D of a gap between the first diffusion part 12 and the cover plate 11 decreases gradually, and a height H of a gap between the second diffusion part 13 and the cover plate 11 increases gradually at first and then decreases gradually.

The gas diffusion device in the embodiment is generally used in relevant procedures such as gas diffusion in the thin film encapsulation of display device such as the OLED display device. Gas materials are placed into a film-forming apparatus comprising the gas diffusion device to diffuse and react therein, and then the gas materials are outputted for film coating of the display device. The diffusion uniformity of the gas influences characteristics such as the surface flatness, the tightness, and the uniformity of the layer coated with the film.

In this embodiment, because the height D of the gas between the first diffusion part 12 and the cover plate 11 decreases gradually, the gas fed into the gas inlet 122 rises and diffuses gradually in the first diffusion space 121 along a direction towards the second diffusion space 131, and the gradual elevation of the height is favorable for the relatively full diffusion of the gas for the first time. Then, the gas flows into the second diffusion space 131 from the first diffusion space 121. Because the height H of the gap between the second diffusion part 13 and the cover plate 11 increases gradually at first and then decreases gradually, the uniform diffusion efficiency of the gas and the utilization ratio of the gas can be improved in the following manner: the gradual increase of the height H of the gap is favorable for the gas to mix uniformly and rapidly after the first time of diffusion so that the gas become uniform, and then the gradual decrease of the height H of the gap further facilitates the uniform diffusion of the uniformly mixed gas before the exiting of the gas. Thus, the effectiveness in the thin film encapsulation of the display device can be improved.

In this embodiment, the height D of the gap between the first diffusion part 12 and the cover plate 11 decreasing gradually in the direction from the gas inlet 122 to the gas outlet 132 may mean that the height D decreases gradually and continuously, e.g., decreases smoothly (which includes for example decreasing along a flat surface, a circular surface, a cambered surface or the like), or means that the height D decreases gradually on the whole without excluding the existence of micro-bumps or micro-grooves or small horizontal planes in the surface of the first diffusion part 12. Similarly, the height H of the gas between the second diffusion part 13 and the cover plate 11 increasing gradually at first and then decreasing gradually may mean that the height D increases smoothly and gradually at first and then decreases smoothly and gradually, or means that the height D on the whole increases gradually at first and then decreases gradually without excluding the existence of micro-bumps or micro-grooves or small horizontal planes in the surface of the second diffusion part 13.

Still referring to FIG. 1, the height D of the gap between the first diffusion part 12 and the cover plate 11 optionally decreases gradually in a linear way, i.e., an inclined surface is defined from the gas inlet 122 to the end of the first diffusion part 12, and an angle is included between the inclined surface and the cover plate 11. In this way, the gas in the first diffusion space 121 can rise and diffuse uniformly. Of course, in other embodiments, the height D of the gap between the first diffusion part 12 and the cover plate 11 may also decrease gradually in a cambered way with the opening of the camber facing the cover plate 11 or away from the cover plate 11, or decrease gradually in a way combining cambered surfaces and flat surfaces, or decrease gradually in a way combining several kinds of cambered surfaces, in the direction from the gas inlet 122 to the gas outlet 132. Moreover, the height D may also decrease gradually in a stepped manner, e.g., in the form of tiny steps.

Referring to FIG. 1, a change in height D of the gap between the first diffusion part 12 and the cover plate 11 may be 5 mm to 15 mm. Alternatively, the height D of the gap may be 6 mm to 12 mm, or 7 mm to 10 mm, as the height D of the gap between the first diffusion part 12 and the cover plate 11 decreases gradually. For example, the height of the gap between the first diffusion part 12 and the cover plate 11 at a position adjacent to the gas inlet 122 is 15 mm, and the height of the gap between the end of the first diffusion part 12 (i.e., a position in communication with the second diffusion space 131) and the cover plate 11 is 5 mm.

Still referring to FIG. 1, optionally, the height H of the gap between the second diffusion part 13 and the cover plate 11 increases gradually at first and then decreases gradually in a curvilinear way. Specifically, a surface of the second diffusion part 13 that faces the cover plate 11 is a cambered surface (i.e., is of a curved line from the side viewing angle or in the cross section), and the height H of the gap between the cambered surface and the cover plate 11 increases gradually at first and then decreases gradually. Increasing in height gradually at first and then decreasing in height gradually in a curvilinear way can enable the gas to diffuse uniformly after being mixed smoothly in the second diffusion space 131, and the curvilinear design can prevent the flowing of the gas from being blocked and thus cannot diffuse uniformly.

A change in the height H of the gap between the second diffusion part 13 and the cover plate 11 is optionally 5 mm to 10 mm. Alternatively, the height H of the gap may be 6 mm to 9 mm, or 7 mm to 8 mm, as the height H of the gap between the second diffusion part 13 and the cover plate 11 increases gradually. For example, the height H of the gap between a position of the second diffusion part 13 that is in communication with the first diffusion space 121 and the cover plate 11 is 5 mm, and the height H of the gap between the cover plate 11 and a position of the second diffusion part 13 that is away from the cover plate 11 is 10 mm.

Referring to FIG. 1, a maximum height H of the gap between the second diffusion part 13 and the cover plate 11 is optionally smaller than a maximum height D of the gap between the first diffusion part 12 and the cover plate 11. In this way, the gas in the second diffusion space 131 can mix relatively rapidly as the height H of the gap increases gradually. Of course, in other embodiments, the maximum height H of the gap between the second diffusion part 13 and the cover plate 11 may also equal to the maximum height D of the gap between the first diffusion part 12 and the cover plate 11. A difference between the maximum height D of the gap that is between the first diffusion part 12 and the cover plate 11 and the maximum height H of the gap that is between the second diffusion part 13 and the cover plate 11 optionally ranges from 2 mm to 5 mm for example, and this can ensure the speed as well as the uniformity and the effectiveness in the mixing of the gas.

Figure 2:
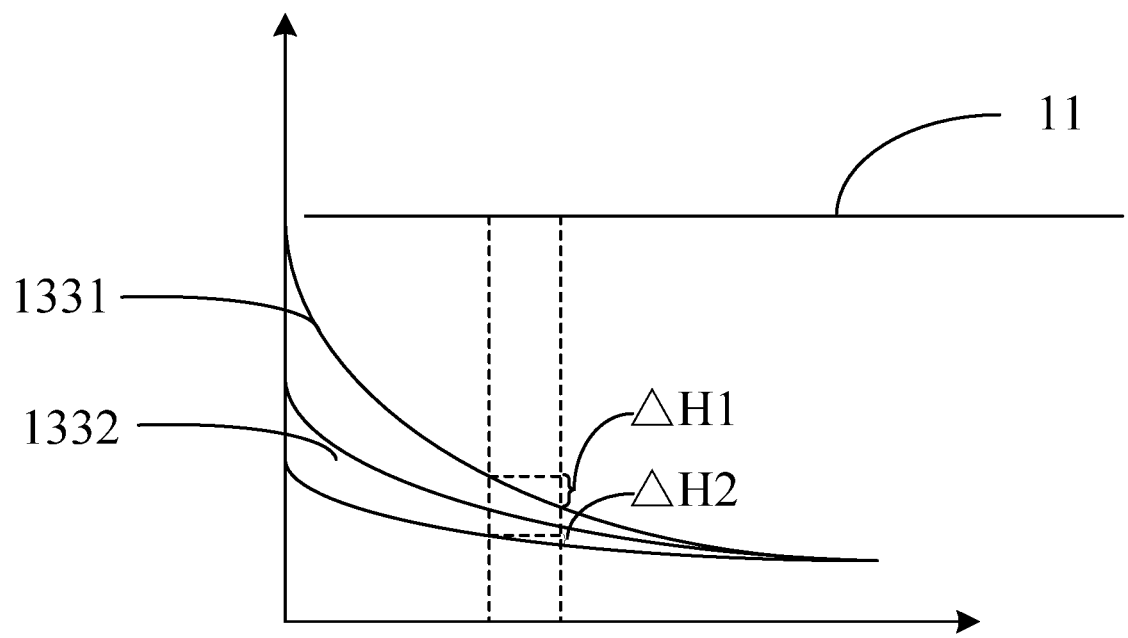
FIG. 2 is a schematic view illustrating a change in height of the gap with the cover plate from a central region to two sides in an embodiment of gas diffusion according to the present disclosure.
Figure 3:
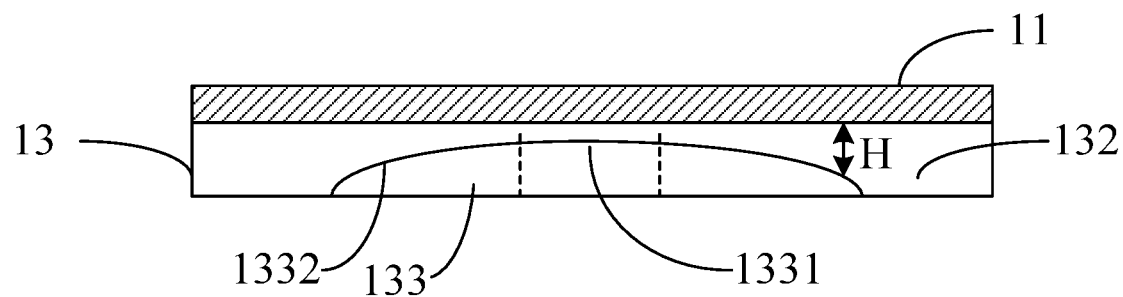
FIG. 3 is a schematic structural left view of an embodiment of gas diffusion according to the present disclosure.

Referring to FIG. 1 to FIG. 3, a rate of change in the height H of the gap between the second diffusion part 13 and the cover plate 11 optionally decreases gradually from a central region 1331 of the gas outlet 132 towards two sides 1332 as the height H of the gap between the second diffusion part 13 and the cover plate 11 decreases gradually. In this embodiment, the rate of change can refer to the speed of the change in the height. That is, the change in the height H of the gap between the second diffusion part 13 and the cover plate 11 is faster in the central region 1331 of the gas outlet 132, and the change in the height H become slower in the two sides 1332 and the value thereof decreases gradually from the center region 1331 of the gas outlet 132 towards the two sides 1332, as the height H of the gap between the second diffusion part 13 and the cover plate 11 decreases gradually. In other words, the change in the height H of the gap between the second diffusion part 13 and the cover plate 11 is relatively larger in the central region 1331 of the gas outlet 132 and decreases gradually from the center region 1331 of the gas outlet 132 towards the two sides 1332, as the height H of the gap between the second diffusion part 13 and the cover plate 11 decreases gradually. It can be considered that the incline degree of the central region 1331 is larger in the central region 1331 and the incline degree decreases gradually from the central region 1331 towards the two sides 1332 as the height H of the gap between the second diffusion part 13 and the cover plate 11 decreases gradually. In this way, the gas release from the gas outlet 132 is more smooth, and the design conforming to fluid mechanics can guide the gas to diffuse uniformly and then exit.

Referring to FIG. 3, a convex portion 133 is provided in the central region 1331 of the gas outlet 132 in the second diffusion part 13. For example, the convex portion 133 is arc-shaped and two sides of the convex portion 133 do not contact with two sides of the second diffusion part 13. For example, the convex portion 133 extends into the second diffusion space 131. During a process of gas inflow to gas outflow, the change in the height H of the gap between the second diffusion part 13 and the cover plate 11 is larger at the convex portion 133 than the change in the non-convex region, and the rate of change decreases gradually from the top of the convex portion 133 to two sides of the convex portion 133, as the height H of the gap between the second diffusion part 13 and the cover plate 11 decreases gradually. That is, the rate of change in the height of the gap between the second diffusion part 13 and the cover plate 11 as the distance between the second diffusion part 13 and the cover plate 11 decreases gradually is larger at the central region 1331 and decreases gradually from the central region 1331 towards the two sides 1332.

Referring to FIG. 3, the height H of the gap between the second diffusion part 13 and the cover plate 11 at a position of the gas outlet 132 optionally increases gradually from the central region 1331 of the gas outlet 132 towards the two sides 1332. For example, the height of the gap between the top portion of the arc-shaped convex portion 133 and the cover plate 11 is the minimum, and the height of the gap between the non-top portion of the convex portion 133 and the cover plate 11 increases gradually from the top portion towards the two sides. In this way, the gas can diffuse uniformly in the central region 1331 and the two sides before exiting from the gas outlet 132. Of course, the height H of the gap between the second diffusion part 13 and the cover plate 11 at a position of the gas outlet 132 may increase gradually from the central region 1331 of the gas outlet 132 towards the two sides 1332 in many ways. For example, the convex portion may be a triangular portion, or one side thereof from the central region is an arc and the other side thereof is a straight line that extends into the second diffusion space 131 of the second diffusion part 13. As another example, the center region is arc-shaped while the two sides are in the form of straight lines.

Optionally, the gas inlet 122 is disposed in a dot form and communicates with a bottom corner of the first diffusion space 121 that is away from the cover plate 11, and the gas outlet 132 is disposed in a strip form and communicates with a top corner of the second diffusion space 131 that is near the cover plate 11. In this embodiment, the gas inlet 122 being disposed in a dot form means that the diameter of the gas inlet 122 is relatively small and thus the gas inlet 122 may be considered as being disposed in a dot form relative to the first diffusion space 121. The gas inlet 122 communicates with a bottom corner of the first diffusion space 121, and the height of the gap between the first diffusion part 12 and the cover plate 11 decreases gradually, i.e., a position of the first diffusion part 12 that is in communication with the second diffusion part 13 is adjacent to the cover plate 11. This can facilitate the gas in the second diffusion part 13 to mix and diffuse after the gas diffuses relatively uniformly for the first time in the first diffusion part 12. In this embodiment, the gas outlet 132 is disposed in a strip form, and the strip extends in a direction that is consistent with the width direction of the end of the second diffusion part 13. Thus, the gas mixed and diffused in the second diffusion space 131 can exit uniformly.

Figure 4:
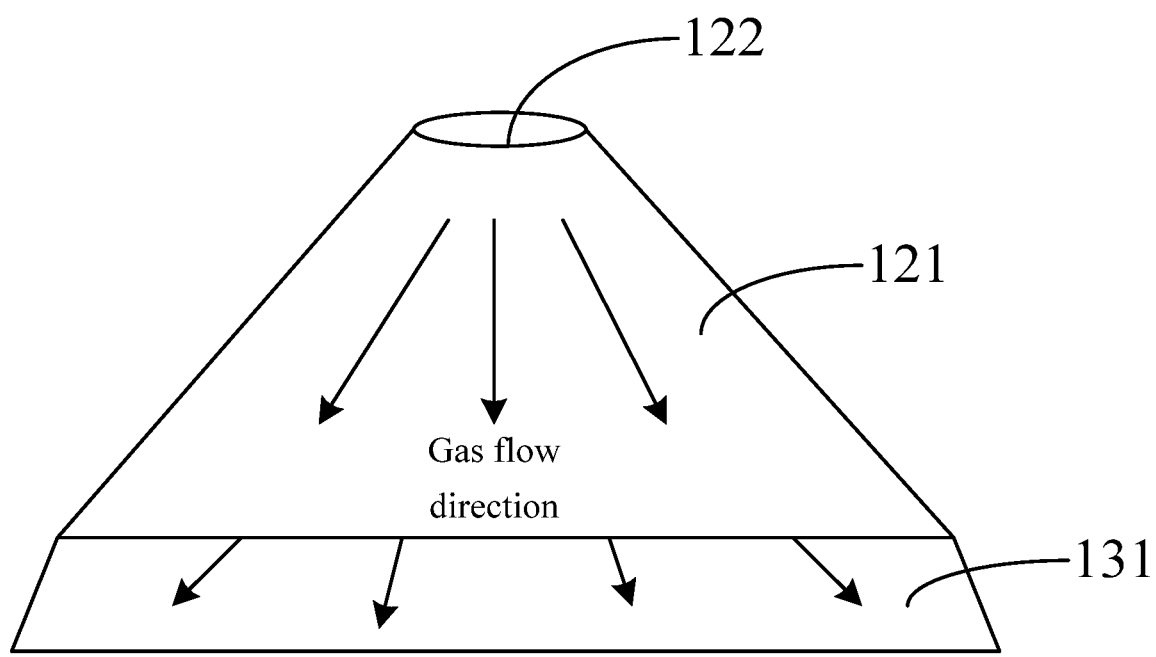
FIG. 4 is a schematic structural top view of a first diffusion part and a second diffusion part in an embodiment of gas diffusion according to the present disclosure.

Referring to FIG. 4, optionally, a projection of the first diffusion space 121 on the cover plate 11 spreads radially relative to the gas inlet 122, a projection of the second diffusion space 131 on the cover plate 11 spreads radially relative to the first diffusion space 121, and a spread angle of the first diffusion space 121 is greater than that of the second diffusion space 131. The first diffusion space 121 spreads radially and the height of the gap between the first diffusion part 12 and the cover plate 11 decreases gradually in the direction from the gas inlet 122 to the gas outlet 132. Such a design of spreading radially in the width direction perpendicular or generally perpendicular to the gas flow direction and decreasing gradually in the height direction of the gap between the first diffusion part 12 and the cover plate 11 can facilitate the sufficient diffusion of the gas in the first diffusion space 121 as well as the mixing and the further diffusion of the gas in the second diffusion space 131. Moreover, the projection of the second diffusion space 131 on the cover plate 11 further spreading radially relative to the first diffusion space 121 can ensure the further diffusion of the gas. Of course, in other embodiments, the projection of the first diffusion space 121 on the cover plate 11 may spread nearly radially relative to the gas inlet 122. For example, edges at two sides of the projection are curved lines or one side of the projection is a curved line and the other side thereof is a straight line after the projection spreads nearly radially. Similarly, the projection of the second diffusion space 131 on the cover plate 11 spreads nearly radially relative to the first diffusion space 121. The radially spreading is not limited to the shape shown in FIG. 4 as long as the projection spreads radially on the whole.

Referring to FIG. 4, the length of the first diffusion part 12 in the direction from gas inflow to gas outflow is optionally greater than the length of the second diffusion part 13 in the direction from gas inflow to gas outflow, and the gas diffuses for two times with the diffusion range thereof in the first diffusion space 121 being larger and the diffusion range in the second diffusion space 131 being smaller for the gas to exit uniformly. Of course, in other embodiments, the length of the first diffusion part 12 in the direction from gas inflow to gas outflow may also equal to the length of the second diffusion part 13 in the direction from gas inflow to gas outflow.

Figure 5:
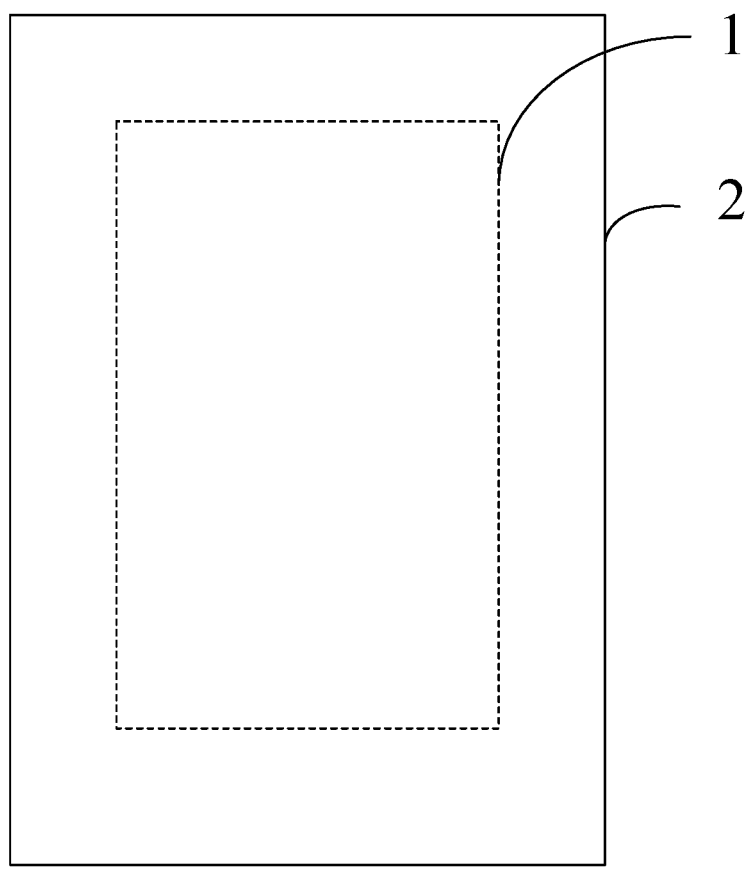
FIG. 5 is a schematic structural view of an embodiment of a film-forming apparatus according to the present disclosure.

Referring to FIG. 5, a film-forming apparatus 2 in an embodiment of the film-forming apparatus according to the present disclosure comprises a gas diffusion device 1 described above in an embodiment of the gas diffusion device according to the present disclosure. The gas diffusion device 1 will not be further described herein, and reference may be made to the above description of the embodiment of the gas diffusion device according to the present disclosure.

According to the above descriptions, in the embodiments of the present disclosure, two times of diffusion are implemented, and in the direction from the gas inlet 122 to the gas outlet 132, the height D of the gas between the first diffusion part 12 and the cover plate 11 decreases gradually, while the height H of the gap between the second diffusion part 13 and the cover plate 11 increases gradually at first and then decreases gradually. This is favorable for the gas to diffuse relatively fully for the first time in the first diffusion space 121 and to mix uniformly and then diffuse sufficiently in the second diffusion space 131 so as to generate uniform gas, thereby forming a film with good surface flatness and tightness during the film coating of the display element.

What described above are only the embodiments of the present disclosure, but are not intended to limit the scope of the present disclosure. Any equivalent structures or equivalent process flow modifications that are made according to the specification and the attached drawings of the present disclosure, or any direct or indirect applications of the present disclosure in other related technical fields shall all be covered within the scope of the present disclosure.

What is claimed is:

1. A gas diffusion device, comprising:
   a cover plate;
   a first diffusion part, cooperating with the cover plate to define a first diffusion space and a gas inlet that communicates with the first diffusion space; and
   a second diffusion part, cooperating with the cover plate to form a second diffusion space and a gas outlet that communicates with the second diffusion space, the second diffusion space communicating with the first diffusion space so that the gas fed into the gas inlet travels through the first diffusion space and the second diffusion space and then exits from the gas outlet;
   wherein in a direction from the gas inlet to the gas outlet, a gap of the first diffusion space between the first diffusion part and the cover plate decreases in height gradually, and a gap of the second diffusion space between the second diffusion part and the cover plate increases in height gradually at first and then decreases in height gradually;
   wherein the cover plate is a whole plate without any hole formed therein, a length of the cover plate is less than a sum of a length of the first diffusion part and a length of the second diffusion part along a direction between the gas inlet and the gas outlet, such that the cover plate does not fully cover the second diffusion part and expose an end of the second diffusion part far away from the first diffusion part to form the gas outlet.

2. The device of claim 1, wherein the gap between the first diffusion part and the cover plate decreases in height gradually in a linear way.

3. The device of claim 1, wherein a change in height of the gap between the first diffusion part and the cover plate is 5 mm to 15 mm as the gap between the first diffusion part and the cover plate decreases in height gradually.

4. The device of claim 1, wherein the gap between the second diffusion part and the cover plate increases in height gradually at first and then decreases in height gradually in a curvilinear way.

5. The device of claim 1, wherein a change in height of the gap between the second diffusion part and the cover plate is 5 mm to 10 mm as the gap between the second diffusion part and the cover plate increases in height gradually.

6. The device of claim 1, wherein a maximum height of the gap between the second diffusion part and the cover plate is smaller than a maximum height of the gap between the first diffusion part and the cover plate.

7. The device of claim 1, wherein a rate of change in height of the gap between the second diffusion part and the cover plate decreases gradually from a central region of the gas outlet towards two sides as the gap between the second diffusion part and the cover plate decreases in height gradually.

8. The device of claim 7, wherein the gap between the second diffusion part and the cover plate at a position of the gas outlet increases in height gradually from the central region of the gas outlet towards the two sides.

9. The device of claim 1, wherein the gas inlet arranged at an end of the first diffusion part far away from the second diffusion part is disposed in a dot form and communicates with a bottom corner of the first diffusion space away from the cover plate such that diameter of the gas inlet is much smaller than the first diffusion part, and the gas outlet is disposed in a strip form and communicates with a top corner of the second diffusion space that is near the cover plate.

10. The device of claim 1, wherein a projection of the first diffusion space on the cover plate spreads radially relative to the gas inlet, a projection of the second diffusion space on the cover plate spreads radially relative to the first diffusion space, and a spread angle of the first diffusion space is greater than that of the second diffusion space.

11. A film-forming apparatus, comprising a gas diffusion device, wherein the gas diffusion device comprises:
    a cover plate;
    a first diffusion part, cooperating with the cover plate to define a first diffusion space and a gas inlet that communicates with the first diffusion space; and
    a second diffusion part, cooperating with the cover plate to form a second diffusion space and a gas outlet that communicates with the second diffusion space, the second diffusion space communicating with the first diffusion space so that the gas fed into the gas inlet travels through the first diffusion space and the second diffusion space and then exits from the gas outlet;
    wherein in a direction from the gas inlet to the gas outlet, a gap of the first diffusion space between the first diffusion part and the cover plate decreases in height gradually, and a gap of the second diffusion space between the second diffusion part and the cover plate increases in height gradually at first and then decreases in height gradually;
    wherein the cover plate is a whole plate without any hole formed therein, a length of the cover plate is less than a sum of a length of the first diffusion part and a length of the second diffusion part along a direction between the gas inlet and the gas outlet, such that the cover plate does not fully cover the second diffusion part and expose an end of the second diffusion part far away from the first diffusion part to form the gas outlet.

12. A gas diffusion device, comprising:
    a cover plate;
    a diffusion portion cooperating with the cover plate to define a first diffusion space and a second diffusion space communicating with the first diffusion space;
    the diffusion portion defining an inlet in the first diffusion space and an outlet in the second diffusion space;
    the diffusion portion having a first surface in the first diffusion space and a second surface in the second diffusion space;
    wherein a first height difference between the first surface and the cover plate gradually decreases along a direction from the inlet to the outlet; and wherein a second height difference between the second surface and the cover plate gradually increases at first and then gradually decreases;

wherein the cover plate is a whole plate without any hole formed therein, a length of the cover plate is less than a sum of a length of the first diffusion part and a length of the second diffusion part along a direction between the gas inlet and the gas outlet, such that the cover plate does not fully cover the second diffusion part and expose an end of the second diffusion part far away from the first diffusion part to form the gas outlet.

13. The device of claim 12, wherein a lowest position exists on the second surface wherein a biggest height difference exists between the second surface and the cover plate, wherein the second surface is substantially symmetrical about the lowest position.

14. The device of claim 12, wherein a highest position exists between the first surface and the second surface for connecting the first surface and second surface, wherein a lowest height difference exists between the first surface, the second surface and the cover plate.

15. The device of claim 14, wherein the lowest height between the first surface, the second surface and the cover plate is 5 mm.

16. The device of claim 1, wherein the gas fed into the gas inlet has a capability of traveling through anywhere of the first diffusion space and anywhere of the second diffusion space, such that the gas has a capability of contacting with anywhere of a surface of the second diffusion space facing towards the cover plate.

17. The apparatus of claim 11, wherein the gas fed into the gas inlet has a capability of traveling through anywhere of the first diffusion space and anywhere of the second diffusion space, such that the gas has a capability of contacting with anywhere of a surface of the second diffusion space facing towards the cover plate.

18. The device of claim 12, wherein the gas fed into the gas inlet has a capability of traveling through anywhere of the first diffusion space and anywhere of the second diffusion space, such that the gas has a capability of contacting with anywhere of a surface of the second diffusion space facing towards the cover plate.

\* \* \* \* \*